(12) United States Patent
Murakami

(10) Patent No.: US 11,330,701 B2
(45) Date of Patent: May 10, 2022

(54) MODULE BOARD AND PRINTED BOARD

(71) Applicant: Kioxia Corporation, Minato-ku (JP)

(72) Inventor: Katsuya Murakami, Sumida (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/812,458

(22) Filed: Mar. 9, 2020

(65) Prior Publication Data

US 2021/0092831 A1    Mar. 25, 2021

(30) Foreign Application Priority Data

Sep. 25, 2019  (JP) .............................. JP2019-173734

(51) Int. Cl.
*H05K 1/18* (2006.01)
*H05K 1/02* (2006.01)
*H05K 1/11* (2006.01)

(52) U.S. Cl.
CPC ........... *H05K 1/0231* (2013.01); *H05K 1/115* (2013.01); *H05K 1/184* (2013.01)

(58) Field of Classification Search
CPC ...... H05K 1/0231; H05K 1/184; H05K 1/115; H05K 1/182; H05K 1/183; H05K 1/185; H05K 1/0206; H05K 1/0204; H05K 2201/10416; H05K 1/021; H01L 23/36; H01L 21/4871; H01L 23/367; H01L 21/4882
See application file for complete search history.

(56) References Cited

U.S. PATENT DOCUMENTS

| 4,628,407 | A | * | 12/1986 | August | ................... H01L 23/36 257/E23.101 |
|---|---|---|---|---|---|
| 5,644,163 | A | * | 7/1997 | Tsuji | ..................... H01L 23/367 257/706 |
| 6,747,217 | B1 | * | 6/2004 | Jochym | .................. H01R 12/58 174/265 |
| 9,433,097 | B2 | | 8/2016 | Tomikawa et al. | |
| 10,141,182 | B1 | * | 11/2018 | Molla | ................. H01L 23/3677 |
| 10,143,092 | B2 | | 11/2018 | Mikado et al. | |
| 2006/0154496 | A1 | * | 7/2006 | Imamura | ................ H05K 1/186 439/66 |
| 2010/0259882 | A1 | * | 10/2010 | Song | ...................... H05K 1/185 361/679.32 |
| 2011/0115001 | A1 | * | 5/2011 | Fujii | ................... H01L 23/3677 257/288 |

(Continued)

FOREIGN PATENT DOCUMENTS

| CN | 105188318 A | 12/2015 |
|---|---|---|
| CN | 206042519 U | 3/2017 |

(Continued)

*Primary Examiner* — Steven T Sawyer
(74) *Attorney, Agent, or Firm* — Oblon, McClelland, Maier & Neustadt, L.L.P.

(57) ABSTRACT

A module board of an embodiment includes a printed board having a through-hole, a semiconductor device mounted on the printed board so as to cover the through-hole, and a heat conductive polygonal column included in the through-hole. The semiconductor device includes a ground terminal or a power supply terminal, the polygonal column is supported by the through-hole at the corners of the polygonal column, and the polygonal column is connected to the ground terminal or the power supply terminal.

7 Claims, 9 Drawing Sheets

(56) References Cited

U.S. PATENT DOCUMENTS

| | | |
|---|---|---|
| 2014/0048313 A1 | 2/2014 | Pan et al. |
| 2014/0144677 A1* | 5/2014 | Wang .................... H05K 1/0206 |
| | | 174/252 |
| 2016/0050794 A1* | 2/2016 | Shih ....................... H05K 3/301 |
| | | 361/711 |
| 2016/0143129 A1* | 5/2016 | Min ...................... H05K 3/4602 |
| | | 174/252 |
| 2016/0143134 A1 | 5/2016 | Tomikawa et al. |
| 2018/0302977 A1* | 10/2018 | Kezuka ................ H05K 3/4644 |
| 2019/0206759 A1* | 7/2019 | Viswanathan ........ H01L 23/367 |
| 2021/0144841 A1* | 5/2021 | Wang .................... H05K 1/0204 |

FOREIGN PATENT DOCUMENTS

| | | |
|---|---|---|
| JP | 2016-15433 A | 1/2016 |
| JP | 2016-96297 A | 5/2016 |
| JP | 2016-149475 A | 8/2016 |
| JP | 2017-69497 A | 4/2017 |
| TW | 201507556 A | 2/2015 |

\* cited by examiner

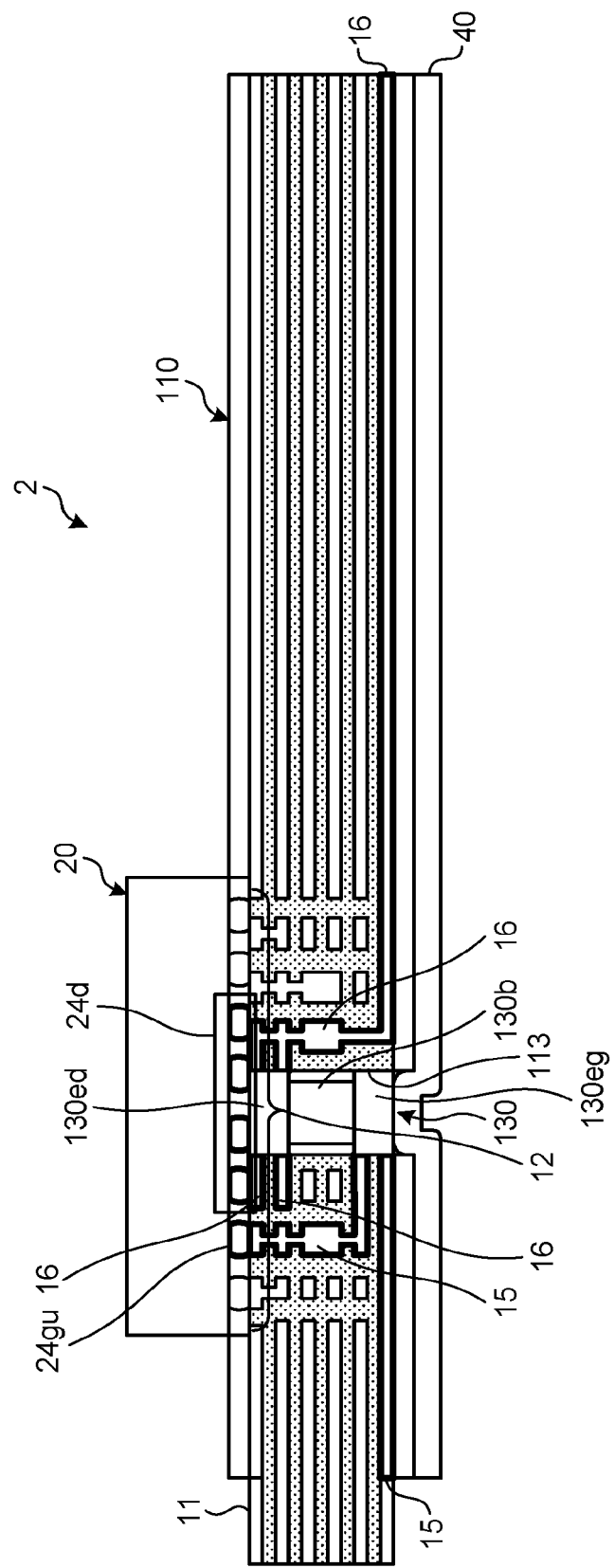

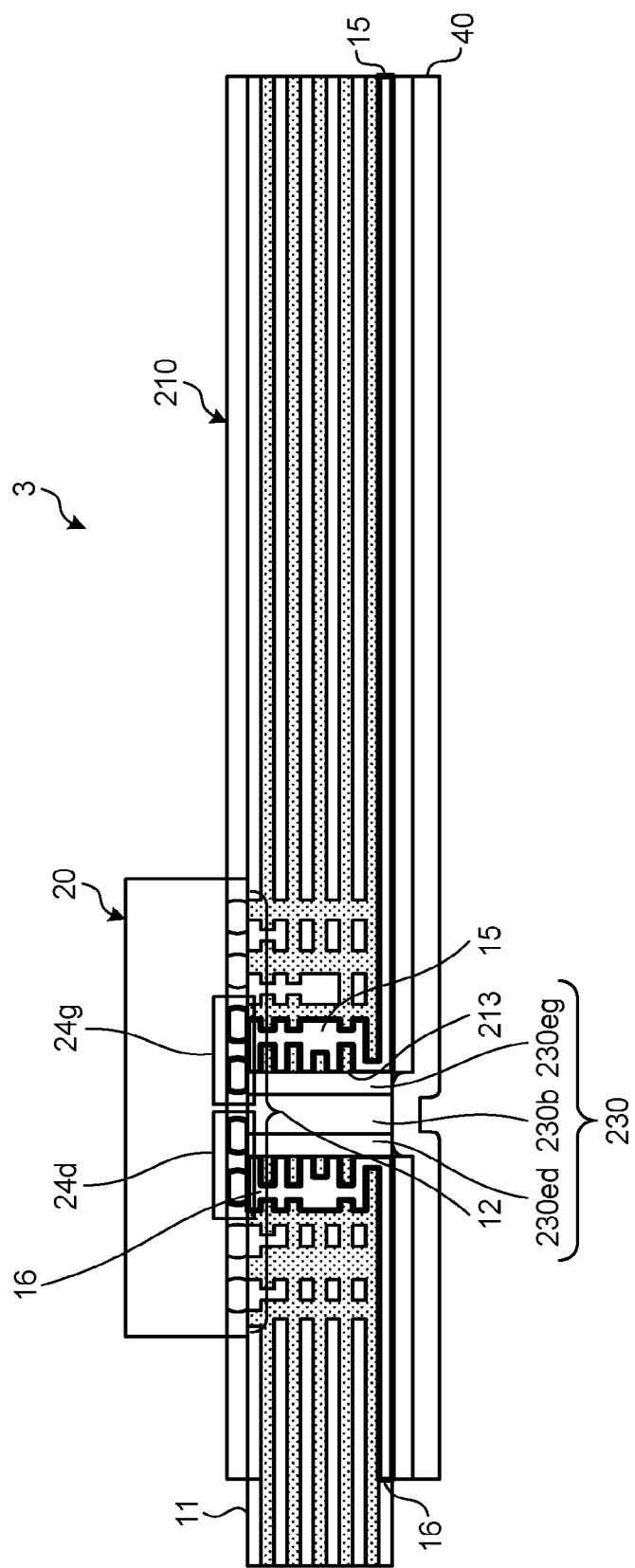

MODULE BOARD AND PRINTED BOARD

CROSS-REFERENCE TO RELATED APPLICATIONS

This application is based upon and claims the benefit of priority from Japanese Patent Application No. 2019-173734, filed on Sep. 25, 2019; the entire contents of which are incorporated herein by reference.

FIELD

Embodiments described herein relate generally to a module board and a printed board.

BACKGROUND

A module board on which a semiconductor device is mounted on a printed board may include a heat dissipation sheet including metal on the rear surface of the printed board for dissipating heat from the semiconductor device. However, only the heat dissipation sheet may not be sufficient to achieve enough heat dissipation.

BRIEF DESCRIPTION OF THE DRAWINGS

FIG. 5 is a cross-sectional view illustrating a configuration example of a module board according to a second embodiment;

FIG. 6 is a cross-sectional view illustrating a configuration example of a module board according to a modification of the second embodiment;

DETAILED DESCRIPTION

A module board of an embodiment includes a printed board having a through-hole, a semiconductor device mounted on the printed board so as to cover the through-hole, and a heat conductive polygonal column included in the through-hole. The semiconductor device has a ground terminal or a power supply terminal, the polygonal column is supported by the through-hole at the corners of the polygonal column, and the polygonal column is connected to the ground terminal or the power supply terminal.

Hereinafter, the present invention is described in detail with reference to the accompanying drawings. Note that the present invention is not limited by the following embodiments. Further, constituent components of the following embodiments include those that readily occur to those skilled in the art or those that are substantially equivalent to those of the embodiments.

First Embodiment

A first embodiment is described with reference to the drawings.

(Configuration Example of Module Board)

Figure 1:
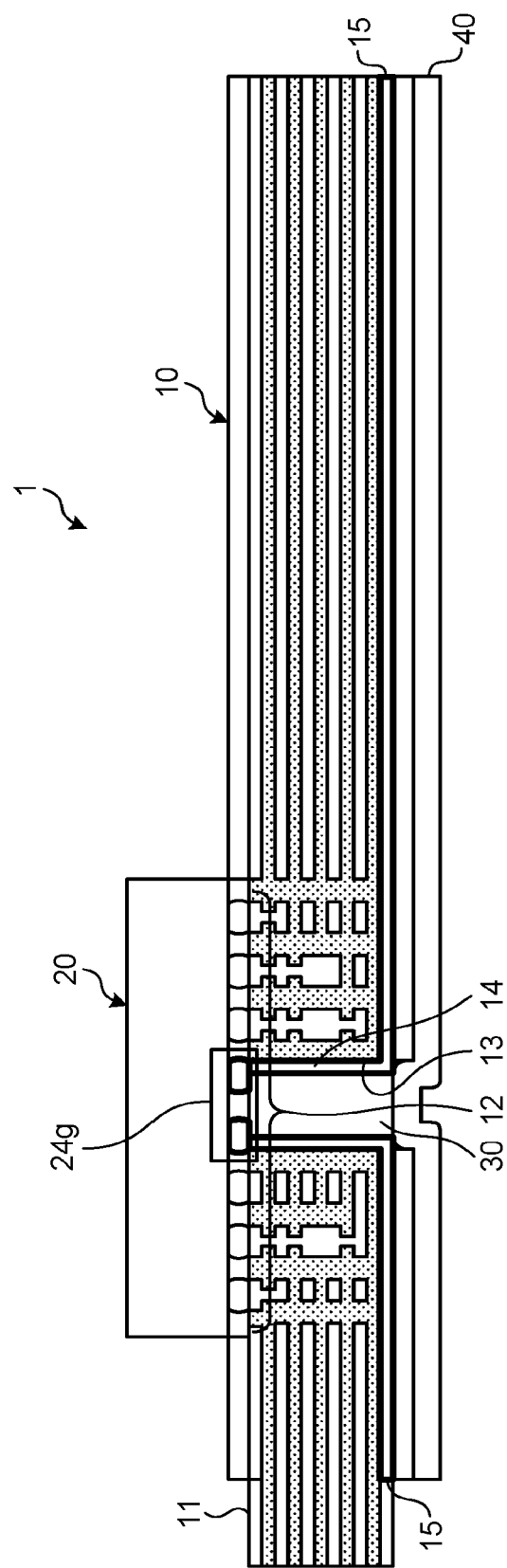
FIG. 1 is a cross-sectional view illustrating a configuration example of a module board according to a first embodiment.

FIG. 1 is a cross-sectional view illustrating a configuration example of a module board 1 according to the first embodiment. As illustrated in FIG. 1, the module board 1 includes a printed board 10 and an IC package 20. The number of IC packages 20 is not limited to one.

The printed board 10 is a resin board including a plurality of wiring layers, vias for connecting the wiring layers, and the like, which are arranged inside and on the surface of the printed board 10. The printed board 10 is formed according to a specification such as M.2, for example.

The IC package 20 is a semiconductor device. The IC package 20 is configured as, for example, a solid state drive (SSD).

Next, the configuration of the printed board 10 is described in detail. The printed board 10 includes a connector 11, a mounting area 12, and the like. The connector 11 is connectable to an external device such as a host computer. The connector 11 is provided at one end of the printed board 10. The mounting area 12 is provided on one surface of the printed board 10. In the mounting area 12, an IC package 20 or the like is mounted.

In the mounting area 12 of the printed board 10, a through-hole 13 that penetrates the printed board 10 is formed. The through-hole 13 is a hole mechanically provided by a drill or the like. A diameter of the through-hole 13 is larger than, for example, a via connecting the wiring layers in the printed board 10.

An inner wall of the through-hole 13 is covered with a metal film 14 formed by copper plating or the like. The metal film 14 is electrically connected to a ground line 15 that is one of wiring layers provided on the printed board 10.

Into the through-hole 13, a metal block 30 is inserted as a heat transfer member. The metal block 30 includes a metal material, such as copper, having excellent heat conductivity. The metal block 30 is electrically connected to the metal film 14 covering the inner wall of the through-hole 13 by mechanical caulking, adhesion using solder or a conductive adhesive, or the like.

On a surface opposite to the surface having the mounting area 12 of the printed board 10, a heat dissipation sheet 40 including a metal such as copper, for example, is disposed. The heat dissipation sheet 40 diffuses heat generated by the IC package 20 mounted on the printed board 10 to promote heat dissipation.

Figure 2:
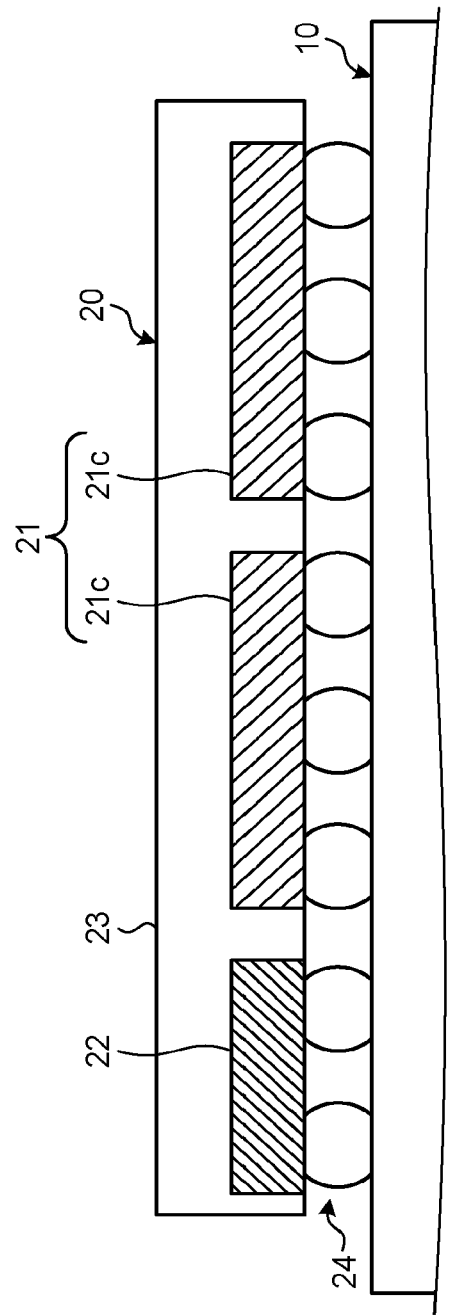
FIG. 2 is a cross-sectional view of an IC package according to the first embodiment.

Next, the configuration of the IC package 20 is described in detail. FIG. 2 is a cross-sectional view of the IC package 20 according to the first embodiment. As illustrated in FIG.

2, the IC package 20 includes a nonvolatile memory 21 and a controller 22 that controls the nonvolatile memory 21.

The nonvolatile memory 21 stores data in a nonvolatile manner. The nonvolatile memory 21 is formed by, for example, a plurality of memory chips 21c. The nonvolatile memory 21 is any one of various storage media such as a NAND flash memory, a NOR flash memory, a resistance random access memory (ReRAM), and a ferroelectric random access memory (FeRAM), for example.

The controller 22 is a semiconductor integrated circuit configured, for example, as a system-on-a-chip (SoC). The controller 22 is configured, for example, as a field-programmable gate array (FPGA) or an application specific integrated circuit (ASIC). The controller 22 controls the operation of the nonvolatile memory 21 in accordance with a request from an external device such as a host computer. For example, the controller 22 reads/writes data from/to the nonvolatile memory 21.

The nonvolatile memory 21 and the controller 22 are sealed with a sealing member 23 as the IC package 20. A plurality of terminals 24 such as a ball grid is provided on one side of the IC package 20. Further, for example, the nonvolatile memory 21 and the controller 22 may be sealed separately instead of being sealed in one IC package 20.

As illustrated in FIG. 1, among the plurality of terminals 24 of the IC package 20, some terminals 24g are electrically connected to at least one of the metal film 14 and the metal block 30. Hereinafter, some terminals 24g are referred to as a plurality of ground terminals. The plurality of ground terminals 24g is electrically connected to the metal block 30 directly or indirectly.

A first wiring includes the ground line 15 and the metal film 14, and is connected to the metal block 30. Thus, the IC package 20 is connected to the ground line 15 via at least one of the metal film 14 and the metal block 30. The first wiring contributes to strengthening the grounding of the IC package 20. The first wiring improves electrical characteristics of the module board 1.

(Configuration Example of Through-Hole)

Figure 3A:
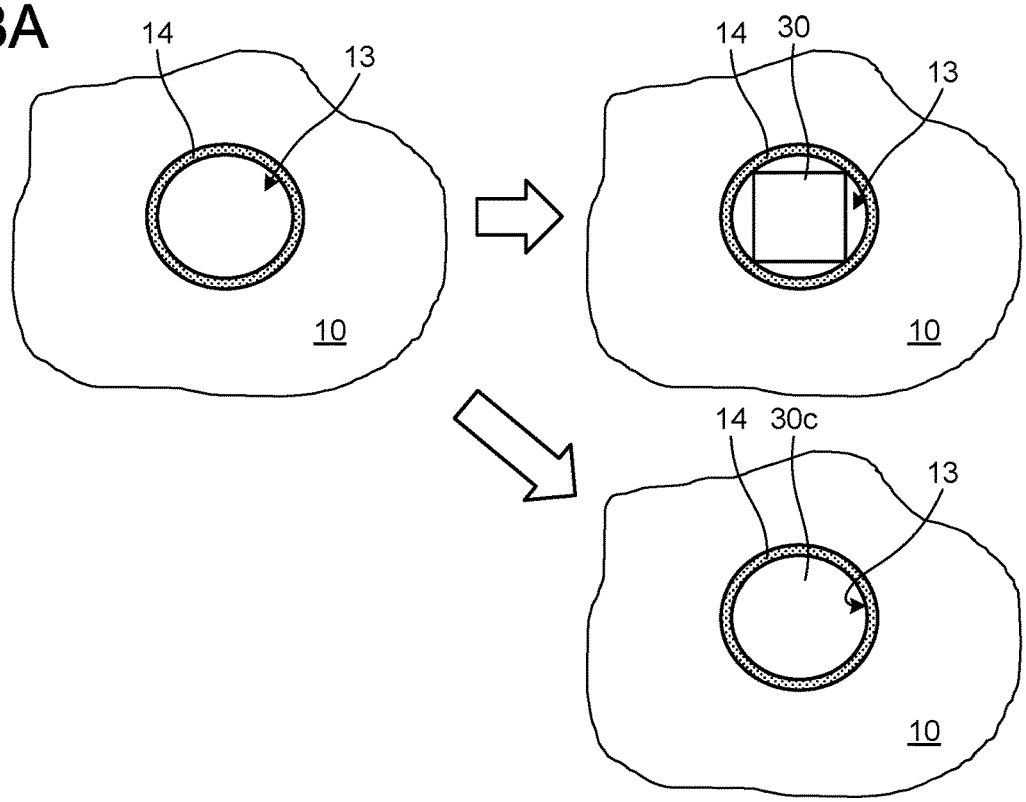
FIG. 3A is a diagram illustrating a first configuration example of a through-hole according to the first embodiment.
Figure 3B:
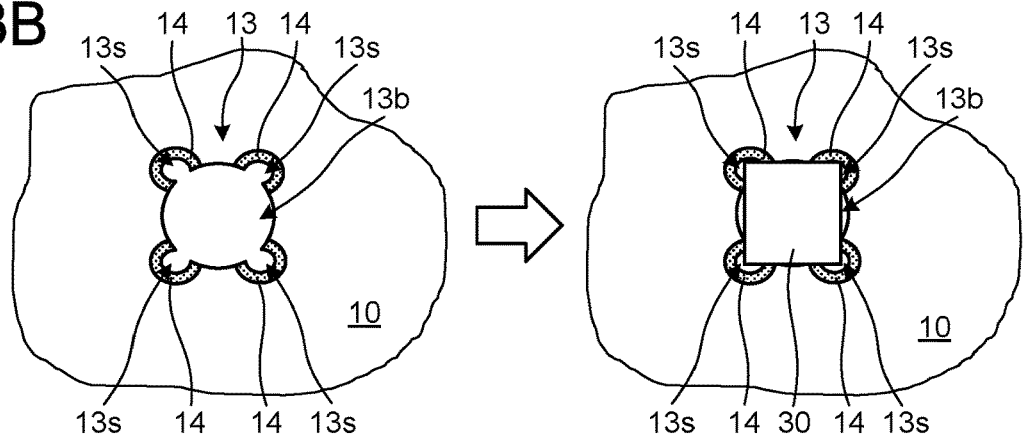
FIG. 3B is a diagram illustrating a second configuration example of the through-hole according to the first embodiment.
Figure 3C:
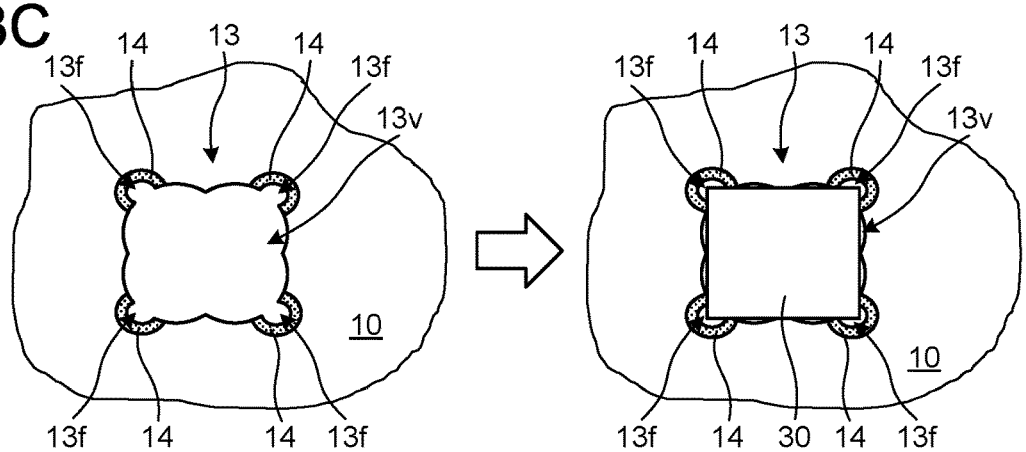
FIG. 3C is a diagram illustrating a third configuration example of the through-hole according to the first embodiment.

Next, with reference to FIGS. 3A, 3B, and 3C, configuration examples of the through-hole 13 included in the printed board 10 of the first embodiment are described. FIG. 3A is a plan view illustrating a first configuration example of the through-hole 13 according to the first embodiment. FIG. 3B is a plan view illustrating a second configuration example of the through-hole 13 according to the first embodiment. FIG. 3C is a plan view illustrating a third configuration example of the through-hole 13 according to the first embodiment.

In the first configuration example of the through-hole 13, the through-hole 13 is substantially circular. The inner wall of the through-hole 13 is covered with a metal film 14. A cross section of the metal block 30 inserted into the through-hole 13 is, for example, a square. Preferably, a length of the diagonal lines of the square is approximately equal to the diameter of the through-hole 13. However, the cross section of the metal block 30 is not limited to a square, and may be another polygon. That is, the shape of the metal block 30 is, for example, a polygonal column. The cross section of the metal block 30c may be substantially circular, as illustrated in FIG. 3A.

In the second configuration example of the through-hole 13, the through-hole 13 includes a first through-hole 13b having a substantially circular shape and four small-diameter second through-holes 13s arranged at approximately equal intervals on the outer periphery of the first through-hole 13b. At least the inner wall of each second through-hole 13s is covered with the metal film 14. To form the through-hole 13 of the second configuration example, the first through-hole 13b is formed using a drill having a relatively large diameter, and the second through-holes 13s are formed using a drill having a small diameter. A cross section of the metal block 30 inserted into the through-hole 13 of the second configuration example is, for example, a square. Preferably, a length of the diagonal lines of the square is approximately equal to the distance between the centers of the two second through-holes 13s facing each other across the first through-hole 13b. The individual second through-holes 13s support each corner of the metal block 30. Thus, the metal block 30 is electrically connected to the metal film 14 of the second through-holes 13s.

In the third configuration example of the through-hole 13, the through-hole 13 includes a third through-hole 13v having a shape formed by a plurality of circles overlapping each other and four fourth through-holes 13f each having a small diameter and arranged at approximately equal intervals on the periphery of the third through-hole 13v. At least the inner wall of each fourth through-hole 13f is covered with the metal film 14. The third through-hole 13v is formed, for example, by using a large-diameter drill multiple times. A cross section of the metal block 30 inserted into the through-hole 13 of the third configuration example is, for example, rectangular. Preferably, a length of the diagonal lines of the rectangle is approximately equal to the distance between the centers of the two fourth through-holes 13f facing each other across the third through-hole 13v.

(Example of Terminal Arrangement)

Figure 4A:
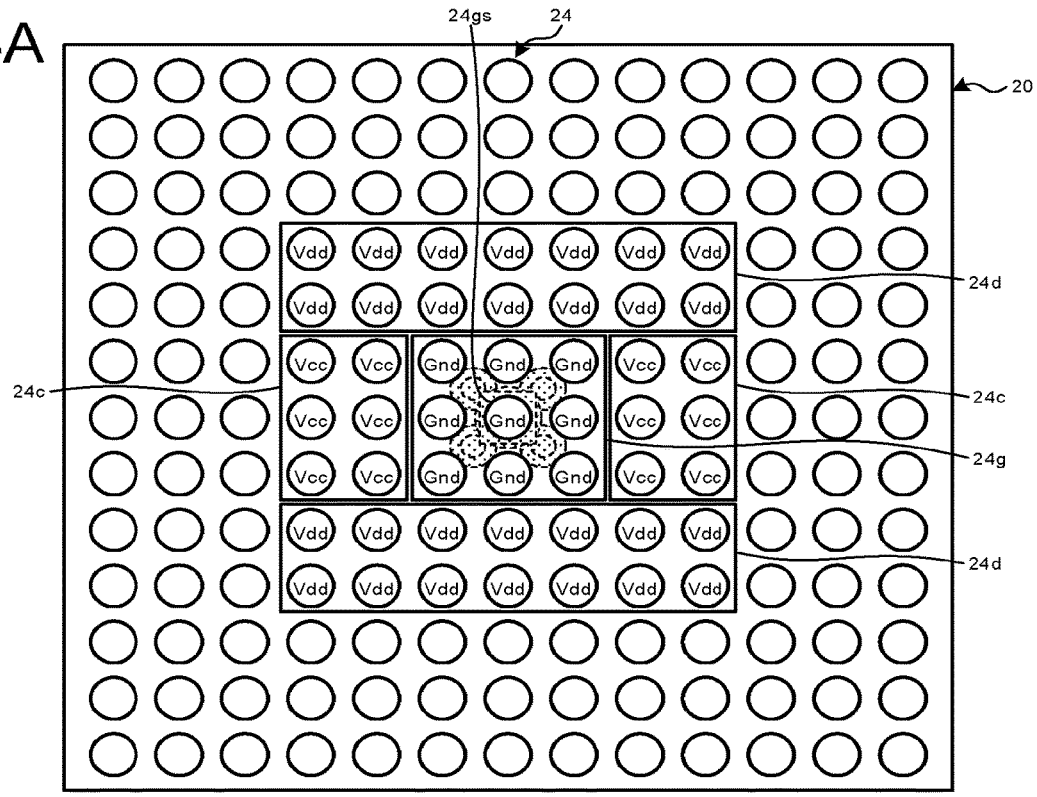
FIG. 4A is a diagram illustrating a first arrangement example of terminals of the IC package according to the first embodiment.
Figure 4B:
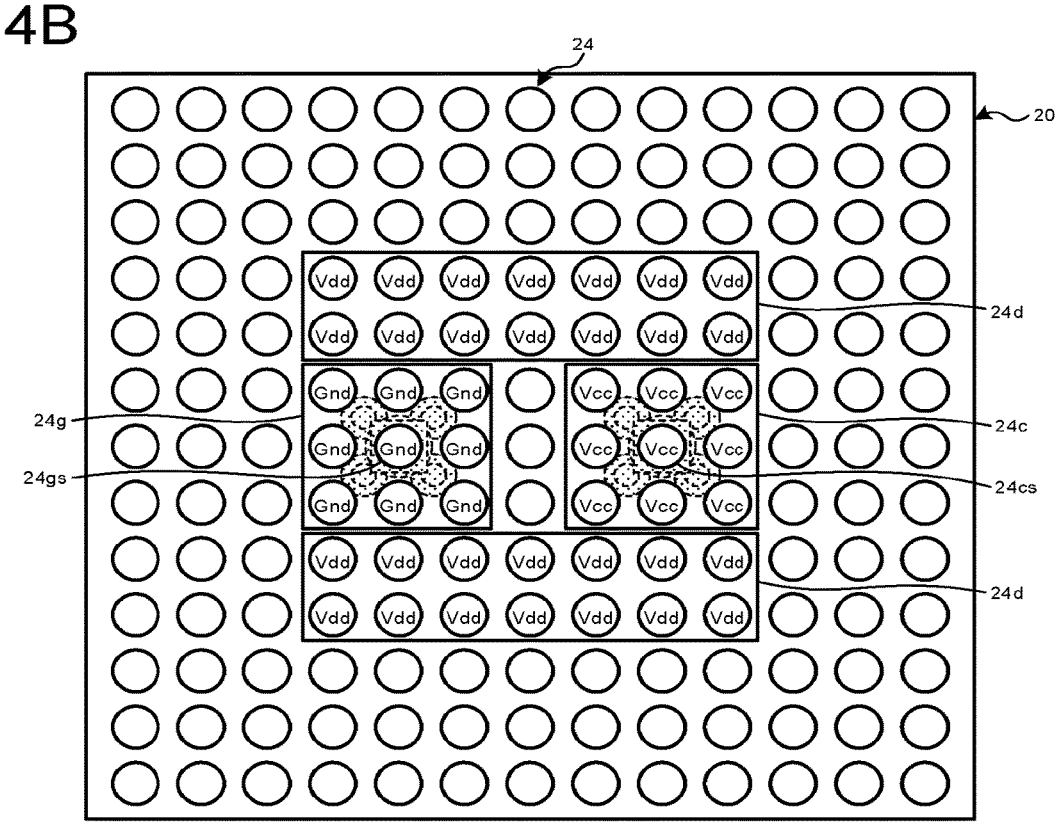
FIG. 4B is a diagram illustrating a second arrangement example of the terminals of the IC package according to the first embodiment.

Next, some arrangement examples of the plurality of terminals 24 included in the IC package 20 of the first embodiment is described with reference to FIGS. 4A and 4B. FIG. 4A is a diagram illustrating a first arrangement example of the terminals 24 of the IC package 20 according to the first embodiment. FIG. 4B is a diagram illustrating a second arrangement example of the terminals 24 of the IC package 20 according to the first embodiment. FIGS. 4A and 4B illustrate the rear surface of the IC package 20, that is, the surface on which the plurality of terminals 24 is arranged in contact with the printed board 10. In FIGS. 4A and 4B, the through-hole 13 and the metal block 30 of the second configuration example are indicated by dotted lines.

In the first arrangement example of the terminals 24, the IC package 20 includes, on its rear surface, the plurality of ground terminals 24g at the center. A plurality of low-voltage power supply terminals 24c and a plurality of high-voltage power supply terminals 24d are arranged around the plurality of ground terminals 24g. The metal block 30 is disposed immediately below a ground terminal 24gs located in the center of the plurality of ground terminals 24g. This allows the ground terminal 24gs to be connected directly to the metal block 30. The other ground terminals 24g are connected, respectively, to the second through-holes 13s having the metal film 14.

In the second arrangement example of the terminals 24, the IC package 20 includes, on its rear surface, the plurality of ground terminals 24g and the plurality of low-voltage power supply terminals 24c. Here, take two opposite sides of the rear surface of the rectangular IC package 20 to make a pair, and assume that a direction extending from one side to the other side of one pair to be a first direction, while a direction extending from one side to the other side of the other pair to be a second direction. The plurality of ground terminals 24g is arranged near the center in the first direction on the rear surface of the IC package 20 and closer to one side in the second direction, that is, at a position away from the center in the second direction. The plurality of low-voltage power supply terminals 24c is located near the center of the rear surface of the IC package 20 in the first direction and closer to the other side in the second direction, that is, in the direction away from the center in the direction opposite to the second direction. A plurality of high-voltage power supply terminals 24d is arranged on both sides of the plurality of ground terminals 24g and the plurality of low-voltage power supply terminals 24c in the first direction described above.

The metal block 30 inserted into the through-hole 13 is located immediately below the center of the plurality of ground terminals 24g. This allows a ground terminal 24gs located in the center of the plurality of ground terminals 24g to be connected directly to the metal block 30. The other ground terminals 24g are connected, respectively, to the plurality of second through-holes 13s.

The metal block 30 inserted into the through-hole 13 is located immediately below the center of the plurality of low-voltage power supply terminals 24c. For this reason, the low-voltage power supply terminal 24cs located in the center of the plurality of low-voltage power supply terminals 24c is connected directly to the metal block 30. The other low-voltage power supply terminals 24c are connected, respectively, to the plurality of second through-holes 13s. Note that when the metal block 30 and the metal film 14 are connected to the plurality of low-voltage power supply terminals 24c, the metal film 14 is connected to a low voltage power line to which a low voltage power supply voltage is applied.

The second wiring includes the low-voltage power line of the printed board 10 and the metal film 14, and is connected to the metal block 30. As a result, the IC package 20 is connected to the low-voltage power line via at least one of the metal film 14 and the metal block 30. The second wiring contributes to strengthening the grounding of the IC package 20. The second wiring improves the electrical characteristics of the module board 1.

According to the module board 1 of the first embodiment, the printed board 10 has the through-hole 13 into which the metal block 30 is inserted. This secures a heat transfer route having a wide cross-sectional area, and promotes heat transfer from the front surface to the rear surface of the printed board 10. Accordingly, the heat from the IC package 20 can be efficiently dissipated.

According to the module board 1 of the first embodiment, the plurality of ground terminals 24g of the IC package 20 is connected to the ground line 15 through the metal block 30 or the metal film 14 on the inner surface of the through-hole 13. This strengthens the grounding of the IC package 20 and improves the electrical characteristics.

According to the module board 1 of the first embodiment, the plurality of low-voltage power supply terminals 24c of the IC package 20 is connected to the low voltage power line of the printed board 10 via the metal block 30 or the metal film 14 on the inner surface of the through-hole 13. This further improves the electrical characteristics of the IC package 20.

According to the module board 1 of the first embodiment, the configuration in which the metal block 30 is inserted into the through-hole 13 is formed by machining. As a result, the configuration that efficiently dissipates heat and improves the electrical characteristics of the IC package 20 is obtained inexpensively and easily.

Second Embodiment

Next, a second embodiment is described. A module board of the second embodiment is different from the first embodiment in the heat transfer member of the printed board.

(Configuration Example of Module Board)

FIG. 5 is a cross-sectional view illustrating a configuration example of a module board 2 according to the second embodiment. As illustrated in FIG. 5, the module board 2 includes a printed board 110 and an IC package 20.

The printed board 110 is a resin board including a plurality of wiring layers, vias for connecting the wiring layers, and the like, which are arranged inside and on the surface of the printed board 110. The printed board 110 is formed according to a specification such as M.2.

The printed board 110 includes a through-hole 113 that penetrates the printed board 110. The through-hole 113 is a hole mechanically provided by a drill or the like. The inner wall of the through-hole 113 is not covered with a metal film. The through-hole 113 is substantially circular. The power line 16 included in the printed board 110 is exposed on the inner wall near the upper end of the through-hole 113. The ground line 15 included in the printed board 110 is exposed on the inner wall near the lower end of the through-hole 113.

A chip capacitor 130 as a heat transfer member is inserted into the through-hole 113. The chip capacitor 130 includes a main body 130b, a power supply external electrode 130ed disposed at one end of the main body 130b, and a grounding external electrode 130eg disposed at the other end. A plurality of ceramic dielectric layers (not illustrated) is arranged in parallel on the main body 130b. The power line 16 exposed on the inner wall of the through-hole 113 is electrically connected to the power supply external electrode 130ed disposed at one end. The ground line 15 is electrically connected to the grounding external electrode 130eg disposed at the other end.

The IC package 20 according to the second embodiment includes a plurality of high-voltage power supply terminals 24d at the center of the surface on which the terminals 24 are provided, for example. The plurality of high-voltage power supply terminals 24d is connected to at least one of the power supply external electrode 130ed of the chip capacitor 130 and the power line 16 of the printed board 110.

The IC package 20 according to the second embodiment has one ground terminal 24gu on the outer edge of the plurality of high-voltage power supply terminals 24d, for example. One ground terminal 24gu is connected to the ground line 15 of the printed board 110.

The first wiring in the second embodiment includes the ground line 15 of the printed board 110, which is connected to the grounding external electrode 130eg disposed on one side of the chip capacitor 130.

The second wiring in the second embodiment includes the power line 16 of the printed board 110, which is connected to the power supply external electrode 130ed disposed on one side of the chip capacitor 130.

According to the module board 2 of the second embodiment, the printed board 110 has the through-hole 113 into which the chip capacitor 130 is inserted. This facilitates heat transfer from the front surface to the rear surface of the printed board 110 and efficiently dissipates heat from the IC package 20.

According to the module board 2 of the second embodiment, the plurality of high-voltage power supply terminals 24d of the IC package 20 is connected to the power line 16 of the printed board 110 directly or through the power supply external electrode 130ed disposed at one end of the chip capacitor 130. In addition, the ground terminal 24gu of the IC package 20 is connected to the ground line 15 of the printed board 110 through the grounding external electrode 130eg disposed at the other end of the chip capacitor 130. This removes noise and improves the electrical characteristics of the IC package 20.

According to the module board 2 of the second embodiment, the chip capacitor 130 electrically connected to the IC package 20 is disposed, for example, in the through-hole 113 immediately below the mounted IC package 20. This allows the chip capacitor 130 to be disposed very close to the IC package 20, thus contributing to the reduction of noise in the IC package 20.

According to the module board 2 of the second embodiment, the configuration in which the chip capacitor 130 is inserted into the through-hole 113 is formed by machining. As a result, the configuration that efficiently dissipates heat and improves the electrical characteristics of the IC package 20 is obtained inexpensively and easily.

Modification of Second Embodiment

Next, a module board 3 according to a modification of the second embodiment is described with reference to FIG. 6. The module board 3 of the modification of the second embodiment is different from the second embodiment in the configuration of a chip capacitor 230 included in a printed board 210.

FIG. 6 is a cross-sectional view illustrating a configuration example of the module board 3 according to a modification of the second embodiment. As illustrated in FIG. 6, the module board 3 includes the printed board 210 and an IC package 20.

The printed board 210 is a resin board including a plurality of wiring layers, vias for connecting the wiring layers, and the like, which are arranged inside and on the surface of the printed board 210. The printed board 210 is formed according to a specification such as M.2.

The printed board 210 includes a through-hole 213 that penetrates the printed board 210. The inner wall of the through-hole 213 may be, or may not be covered with a metal film. The through-hole 213 is substantially circular. The power line 16 of the printed board 210 is exposed on the inner wall of the through-hole 213. The ground line 15 of the printed board 210 is exposed on the inner wall of the through-hole 213.

The chip capacitor 230 is inserted, as a heat transfer member, into the through-hole 213 in the modification of the second embodiment. The chip capacitor 230 includes a main body 230b, a power supply external electrode 230ed, and a grounding external electrode 230eg. The chip capacitor 230 is configured as a chip capacitor with its width and length being transposed and includes the power supply external electrode 230ed and the grounding external electrode 230eg disposed at one end and the other end, respectively, in the transverse direction, instead of the longitudinal direction.

The power line 16 exposed on the inner wall of the through-hole 213 is electrically connected to the power supply external electrode 230ed disposed at one end in the modification of the second embodiment. The ground line 15 is electrically connected to the grounding external electrode 230eg disposed at the other end.

The IC package 20 in the modification of the second embodiment includes the plurality of high-voltage power supply terminals 24d at the center of the surface on which the terminals 24 are provided, for example. The plurality of high-voltage power supply terminals 24d is connected to at least one of the power supply external electrode 230ed of the chip capacitor 230 and the power line 16 of the printed board 210.

For example, the IC package 20 according to the modification of the second embodiment includes a plurality of ground terminals 24g, for example, adjacent to the plurality of high-voltage power supply terminals 24d. The plurality of ground terminals 24g is connected to at least one of the grounding external electrode 230eg of the chip capacitor 230 and the ground line 15 of the printed board 210.

The first wiring in the modification of the second embodiment includes the ground line 15 of the printed board 210 and is connected to the grounding external electrode 230eg of the chip capacitor 230.

The second wiring in the modification of the second embodiment includes the power line 16 of the printed board 210 and is connected to the power supply external electrode 230ed of the chip capacitor 230.

According to the module board 3 of the modification of the second embodiment, the plurality of ground terminals 24g of the IC package 20 is connected to the ground line 15 of the printed board 210 directly or through the grounding external electrode 230eg disposed at one end of the chip capacitor 230. This further strengthens the electrical connection, and removes noise to improve the electrical characteristics of the IC package 20.

Third Embodiment

Next, a third embodiment is described with reference to FIGS. 7, 8A, and 8B. The module board of the third embodiment includes a chip capacitor with its length and width being transposed as a heat transfer member included in the printed board.

Figure 7:
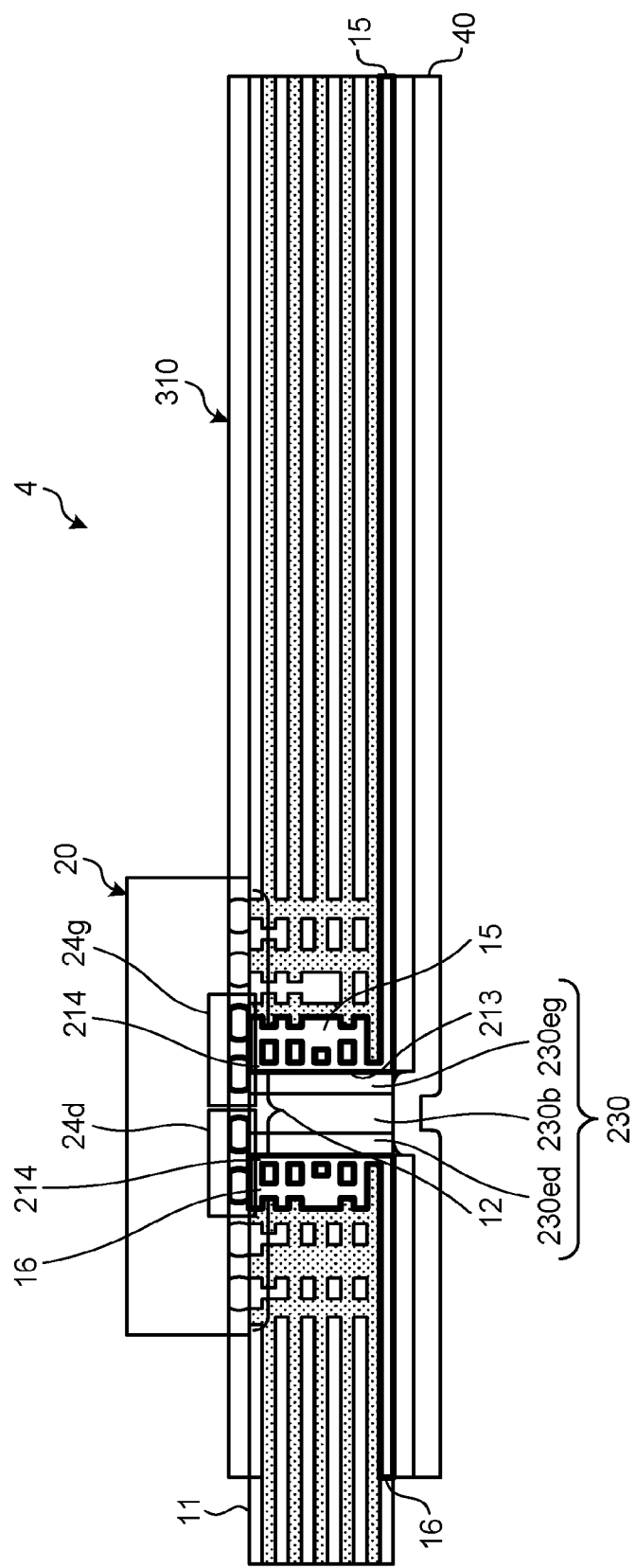
FIG. 7 is a cross-sectional view illustrating a configuration example of a module board according to a third embodiment.

FIG. 7 is a cross-sectional view illustrating a configuration example of the module board 4 according to the third embodiment. The module board 4 includes a printed board 310 and an IC package 20.

The printed board 310 is a resin board including a plurality of wiring layers, vias for connecting the wiring layers, and the like, which are arranged inside and on the surface of the printed board 310. The printed board 310 is formed according to a specification such as M.2.

The printed board 310 includes a through-hole 213 that penetrates the printed board 310. The inner wall of the through-hole 213 is covered with a metal film. The power line 16 included in the printed board 310 is exposed on the inner wall of the through-hole 213. The ground line 15 included in the printed board 310 is exposed on the inner wall of the through-hole 213.

The IC package 20 according to the third embodiment includes a plurality of high-voltage power supply terminals 24d disposed, for example, at the center of the surface on which the terminals 24 are provided. The plurality of high-voltage power supply terminals 24d is connected to at least one of the power supply external electrode 230ed of the chip capacitor 230 and the power line 16 of the printed board 310.

The IC package 20 according to the third embodiment includes the plurality of ground terminals 24g, for example, adjacent to the plurality of high voltage power supply terminals 24d. The plurality of ground terminals 24g is connected to at least one of the grounding external electrode 230eg of the chip capacitor 230 and the ground line 15 of the printed board 310.

Figure 8A:
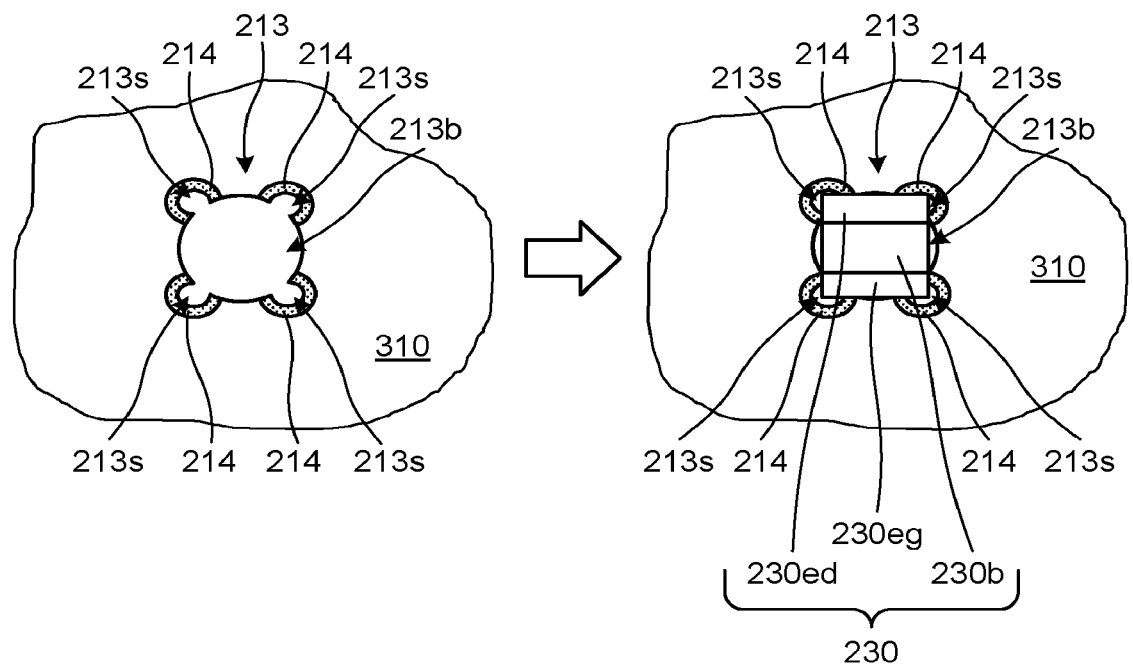
FIG. 8A is a diagram illustrating a first configuration example of the through-hole according to the third embodiment.

FIG. 8A is a diagram illustrating a first configuration example of the through-hole 213 according to the third embodiment. FIG. 8B is a diagram illustrating a second configuration example of the through-hole 213 according to the third embodiment.

As illustrated in FIG. 8A, as the first configuration example of the third embodiment, the through-hole 213 of the printed board 310 includes a first through-hole 213b having a substantially circular shape and four second through-holes 213s each having a small diameter and covered with a metal film 214. The power line 16 of the printed board 310 is connected to the metal film 214 that covers some of the second through-holes 213s. Further, the ground line 15 of the printed board 310 is connected to the metal film 214 that covers some other second through-holes 213s.

Figure 8B:
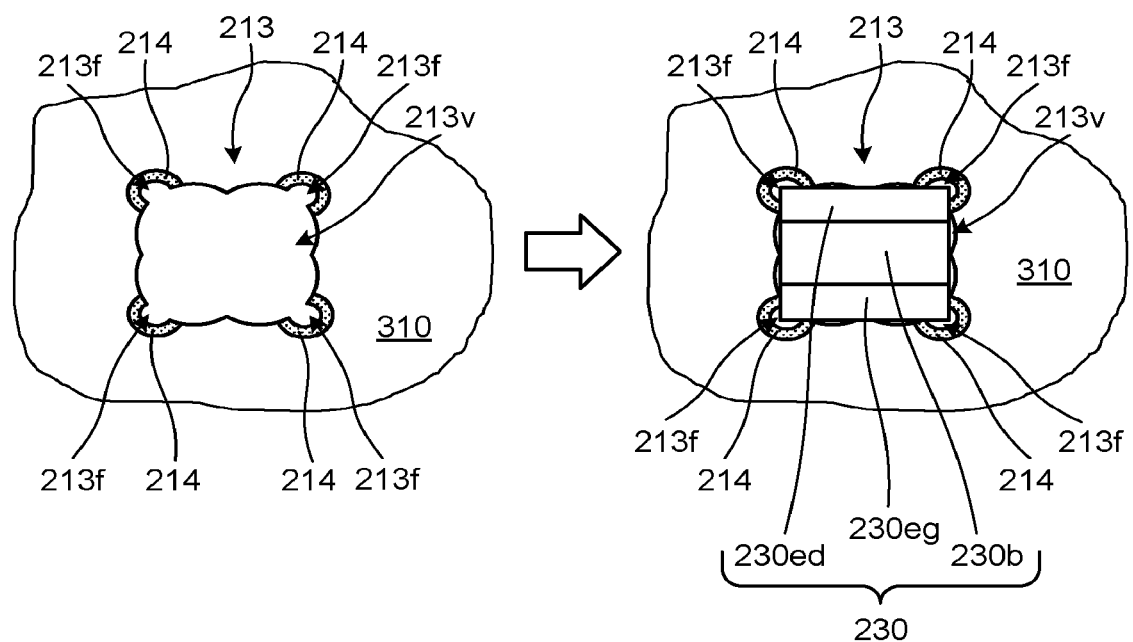
FIG. 8B is a diagram illustrating a second configuration example of the through-hole according to the third embodiment.

As illustrated in FIG. 8B, as the second configuration example of the third embodiment, the through-hole 213 of the printed board 310 includes a substantially circular third through-hole 213v and four fourth through-holes 213f each having a small diameter and covered with the metal film 214. The power line 16 of the printed board 310 is connected to the metal film 214 that covers some of the fourth through-holes 213f. In addition, the ground line 15 included in the printed board 310 is connected to the metal film 214 that covers some other fourth through-holes 213f.

A chip capacitor 230 is inserted, as a heat transfer member, into the first through-hole 213b or the third through-hole 213v. The chip capacitor 230 includes a main body 230b, a power supply external electrode 230ed, and a grounding external electrode 230eg. The chip capacitor 230 is configured as a chip capacitor with its width and length being transposed and includes the power supply external electrode 230ed and the grounding external electrode 230eg disposed at one end and the other end, respectively, in the transverse direction, instead of the longitudinal direction.

The power line 16 and the power supply external electrode 230ed, which are exposed on the inner wall of the first through-hole 213b or the third through-hole 213v, are electrically connected directly or through the metal film 214 covering the inner wall of the second through-hole 213s or the fourth through-holes 213f. Further, the ground line 15 and the grounding external electrode 230eg are electrically connected directly or through the metal film 214 covering the inner wall of the second through-hole 213s or the fourth through-holes 213f.

The first wiring in the third embodiment includes the ground line 15 of the printed board 310 and is connected to the grounding external electrode 230eg disposed at one end of the chip capacitor 230. The first wiring may include the metal film 214 formed on the inner wall of the small-diameter second through-holes 213s or the fourth through-holes 213f.

The second wiring in the third embodiment includes the power line 16 of the printed board 310 and is connected to the power supply external electrode 230ed disposed at the other end of the chip capacitor 230. The second wiring may include the metal film 214 formed on the inner wall of the small-diameter second through-holes 213s or the fourth through-holes 213f.

Figure 9:
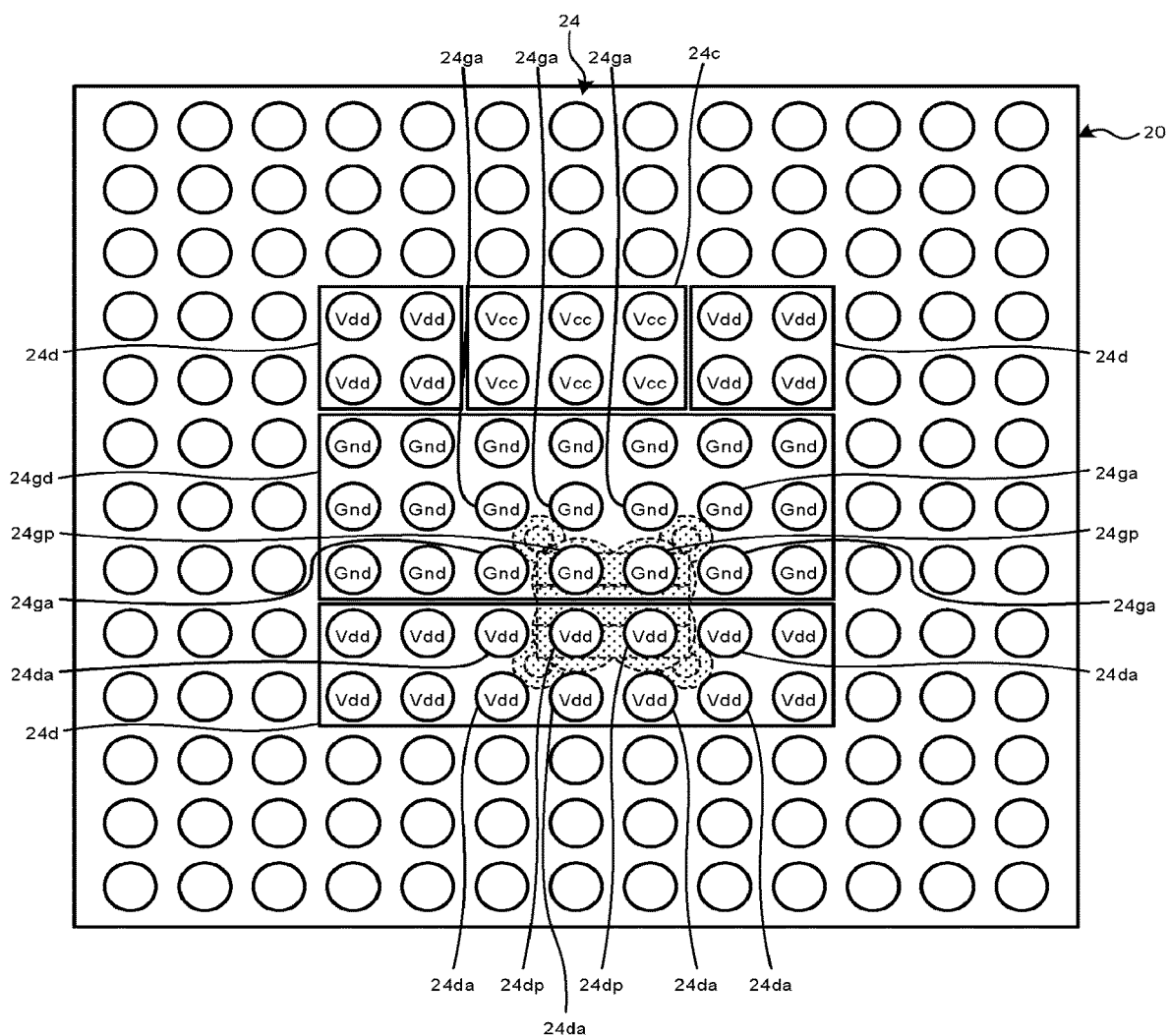
FIG. 9 is a plan view illustrating an arrangement example of terminals of the IC package according to the third embodiment.

FIG. 9 is a plan view illustrating an arrangement example of the terminals 24 of the IC package 20 according to the third embodiment. FIG. 9 illustrates the rear surface of the IC package 20, that is, the surface on which the plurality of terminals 24 is arranged in contact with the printed board 310. In FIG. 9, the through-holes 213 (third through-hole 213v and fourth through-holes 213f) of the second configuration example of the third embodiment and the chip capacitor 230 inserted into the through-holes 213 are indicated by dotted lines.

In the example of FIG. 9, the IC package 20 includes a plurality of ground terminals 24gd near the center of the rear surface. Here, take two opposite sides of the rear surface of the rectangular IC package 20 to make a pair, and assume that a direction extending from one side of one pair to the other side of the one pair to be a first direction, while a direction extending from one side of the other pair to the other side of the other pair to be a second direction. On the rear surface of the IC package 20, a plurality of high-voltage power supply terminals 24d is arranged on one side of a plurality of ground terminals 24gd in the first direction described above. The plurality of high-voltage power supply terminals 24d and the plurality of low-voltage power supply terminals 24c are arranged on the other side of the plurality of ground terminals 24gd in the first direction described above. The plurality of low-voltage power supply terminals 24c is arranged near the center in the second direction described above. The plurality of high-voltage power supply terminals 24d is disposed on both sides of the plurality of low-voltage power supply terminals 24c in the second direction described above.

In the example of FIG. 9, the grounding external electrode 230eg of the chip capacitor 230 is disposed immediately below some ground terminals 24gp among the plurality of ground terminals 24gd. The ground terminals 24gp and the grounding external electrode 230eg are directly connected. Some other ground terminals 24ga are connected to any one of the fourth through-holes 213f covered with the metal film 214.

The power supply external electrode 230ed of the chip capacitor 230 is disposed immediately below some of the high-voltage power supply terminals 24dp among the plurality of high-voltage power supply terminals 24d in the example of FIG. 9. The high-voltage power supply terminals 24dp and the power supply external electrode 230ed are directly connected. Some other high-voltage power supply terminals 24da are connected to any one of the fourth through-holes 213f covered with the metal film 214.

According to the module board 4 of the modification of the third embodiment, the plurality of ground terminals 24g, some of the ground terminals 24gp, or some other ground terminals 24ga of the IC package 20 are connected to the ground line 15 of the printed board 310 directly or through the grounding external electrode 230eg disposed at one end of the chip capacitor 230. This further strengthens the electrical connection, and removes noise to improve the electrical characteristics of the IC package 20.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A module board comprising:
   a printed board including a through-hole and a first wiring that is arranged on an inner wall of the through-hole and on a first surface of the printed board, the first wiring extending along the inner wall of the through-hole continuously and reaching the first surface of the printed board;
   a semiconductor device mounted on a second surface opposite to the first surface of the printed board so as to cover the through-hole; and a heat conductive polygonal column included in the through-hole, wherein
the printed board includes a heat dissipation sheet disposed on the first surface,
the semiconductor device has a ground terminal,
the polygonal column is supported by the through-hole at corners of the polygonal column,
the polygonal column is connected to the first wiring in the through-hole,
the polygonal column is connected to the ground terminal,
the polygonal column is connected to the heat dissipation sheet,
a shape of the through-hole when viewed from the second surface includes a plurality of first arcs and a plurality of second arcs,
a curvature of the second arcs is smaller than a curvature of the first arcs, and
one of the second arcs is disposed between one of the first arcs and another of the first arcs.

2. The module board according to claim 1, wherein
the polygonal column is a metal block,
an inner wall of the through-hole is covered with a metal film, and
the metal block or the metal film is electrically connected to the ground terminal.

3. The module board according to claim 1, wherein
the polygonal column is a chip capacitor, and
the chip capacitor includes
a first external electrode electrically connected to a power supply terminal, and
a second external electrode electrically connected to the ground terminal.

4. The module board according to claim 1, wherein the semiconductor device includes a nonvolatile memory and a controller that controls the nonvolatile memory.

5. The module board according to claim 1, wherein
the polygonal column is a metal block,
an inner wall of the through-hole is covered with a metal film, the metal film being a part of the first wiring, and
the metal block or the metal film is electrically connected to the ground terminal.

6. The module board according to claim 3, wherein a shape of the polygonal column when viewed from the second surface is substantially circular.

7. A printed board comprising:
a mounting area where a semiconductor device is mountable;
a through-hole; and
a first wiring that is arranged on an inner wall of the through-hole and on a first surface of the printed board, the first wiring extending along the inner wall of the through-hole continuously and reaching the first surface of the printed board, wherein
the printed board includes a heat dissipation sheet disposed on the first surface,
the through-hole is formed in the mounting area,
a heat conductive polygonal column is configured to be provided in the through-hole, the heat conductive polygonal column in the through-hole being configured to be connected to the semiconductor device, the first wiring, and the heat dissipation sheet,
a shape of the through-hole when viewed from the mounting area includes a plurality of first arcs and a plurality of second arcs,
a curvature of the second arcs is smaller than a curvature of the first arcs, and
one of the second arcs is disposed between one of the first arcs and another of the first arcs.

* * * * *